US008053309B2

(12) United States Patent
Lee

(10) Patent No.: US 8,053,309 B2
(45) Date of Patent: Nov. 8, 2011

(54) METHODS OF FABRICATING SEMICONDUCTOR DEVICES

(75) Inventor: In-jung Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/656,172

(22) Filed: Jan. 20, 2010

(65) Prior Publication Data

US 2010/0124806 A1    May 20, 2010

Related U.S. Application Data

(62) Division of application No. 11/812,581, filed on Jun. 20, 2007, now abandoned.

(30) Foreign Application Priority Data

Jul. 6, 2006    (KR) .................... 10-2006-0063534

(51) Int. Cl.
*H01L 21/8242*    (2006.01)

(52) U.S. Cl. ................. 438/243; 257/301; 257/E21.646; 438/218; 438/221

(58) Field of Classification Search .................. 438/243; 257/301

See application file for complete search history.

(56) References Cited

U.S. PATENT DOCUMENTS

| 6,503,793 | B1 * | 1/2003 | Chittipeddi et al. | 438/243 |
| 7,015,090 | B2 * | 3/2006 | Okazaki et al. | 438/243 |
| 7,022,565 | B1 * | 4/2006 | Kao | 438/210 |
| 7,037,776 | B2 * | 5/2006 | Huang et al. | 438/243 |
| 7,414,278 | B2 * | 8/2008 | Sugatani et al. | 257/296 |
| 2001/0052610 | A1 * | 12/2001 | Leung et al. | 257/296 |
| 2002/0053691 | A1 * | 5/2002 | Leung et al. | 257/296 |
| 2002/0158303 | A1 * | 10/2002 | Kuroi et al. | 257/510 |
| 2006/0033141 | A1 * | 2/2006 | Okazaki et al. | 257/301 |
| 2007/0298567 | A1 * | 12/2007 | Lee et al. | 438/243 |

FOREIGN PATENT DOCUMENTS

| JP | 62-067862 | 3/1987 |
| KR | 100266281 B1 | 6/2000 |
| KR | 10-2005-0063102 | 6/2005 |
| KR | 10-2005-0070799 | 7/2005 |

OTHER PUBLICATIONS

Korean Patent Office Action dated Aug. 28, 2007, for corresponding Korean Patent Application No. 10-2006-0063534.

* cited by examiner

*Primary Examiner* — Kenneth Parker
*Assistant Examiner* — David Spalla
(74) *Attorney, Agent, or Firm* — Harness, Dickey & Pierce, P.L.C.

(57) ABSTRACT

A semiconductor device includes a semiconductor substrate that includes first and second regions; first, second, and third insulating layers; a capacitor dielectric layer that includes first and second dielectric layers; a gate insulating layer formed on the first and second regions; a gate formed on the gate insulating layer of the second region; a first capacitor electrode formed on the capacitor dielectric layer; and impurity regions formed in the semiconductor substrate on sides of the gate. The first and second regions include first and second trenches, respectively. The third insulating layer is formed on the second insulating layer, which is formed on the first insulating layer, which is formed on an inner surface of the second trench. The second dielectric layer is formed on the first dielectric layer, which is formed on an inner surface of the first trench.

20 Claims, 7 Drawing Sheets

METHODS OF FABRICATING SEMICONDUCTOR DEVICES

CROSS-REFERENCE TO RELATED APPLICATION(S)

This application is a divisional application of U.S. patent application Ser. No. 11/812,581, filed on Jun. 20, 2007now abandoned, and claims the associated benefit under 35 U.S.C. §120. Both this application and U.S. patent application Ser. No. 11/812,581 claim priority from Korean Patent Application No. 10-2006-0063534, filed on Jul. 6, 2006, in the Korean Intellectual Property Office (KIPO). The entire contents of both U.S. patent application Ser. No. 11/812,581 and Korean Patent Application No. 10-2006-0063534 are incorporated herein by reference.

BACKGROUND

1. Field

Example embodiments relate to semiconductor devices. Also, example embodiments relate to semiconductor devices including a capacitor in a shallow trench isolation (STI) structure, and methods of fabricating the semiconductor devices.

2. Description of the Related Art

Generally, a capacitor of a semiconductor device is formed to improve the protection of the semiconductor device against electromagnetic interference (EMI) and to facilitate voltage stabilization. The capacitor may be a depletion NMOS capacitor, a polysilicon-insulator-polysilicon (PIP) capacitor, a metal-insulator-metal (MIM) capacitor, and the like. In order to integrate the capacitor in the semiconductor device for EMI improvement and voltage stabilization, a separate active region for the capacitor may be required. Thus, scaling down the chip size is difficult. Furthermore, since an additional process of forming the capacitor is necessary, the manufacturing process of the semiconductor device becomes complicated.

SUMMARY

Example embodiments provide semiconductor devices that may be fabricated in a simple process to have a reduced chip size, and methods of fabricating the semiconductor devices.

According to example embodiments, semiconductor devices may include a semiconductor substrate that includes first and second regions; first, second, and third insulating layers; a capacitor dielectric layer that includes first and second dielectric layers; a gate insulating layer formed on the first and second regions; a gate formed on the gate insulating layer of the second region; a first capacitor electrode formed on the capacitor dielectric layer; and/or impurity regions formed in the semiconductor substrate on sides of the gate. The first region may include a first trench having a first depth. The second region may include a second trench having a second depth. The first insulating layer may be formed on an inner surface of the second trench. The second insulating layer may be formed on the first insulating layer. The third insulating layer may be formed on the second insulating layer. The first dielectric layer may be formed on an inner surface of the first trench. The second dielectric layer may be formed on the first dielectric layer.

The first insulating layer may be an oxide layer, such as a sidewall oxide layer, and/or the second insulating layer may be a nitride layer, such as a nitride layer liner. The capacitor dielectric layer may further include a third dielectric layer, and the third dielectric layer may be the gate insulating layer formed on the second dielectric layer. The first capacitor electrode may be composed of the same material as that of the gate. The semiconductor substrate may function as a second capacitor electrode. A bottom of the first trench may include one or more stripe-shaped recesses extending in the same direction, one or more mesh-shaped recesses, and/or one or more other shapes.

The semiconductor device may further include a first well, formed in the semiconductor substrate of the first region, and having a first junction depth greater than the first depth of the first trench, which may be formed in the first well; and/or a second well, formed in the semiconductor substrate of the second region, and having a second junction depth greater than the second depth of the second trench, which may be formed in the second well. The first well may function as a second capacitor electrode. The first junction depth of the first well may be greater than or equal to the second junction depth of the second well. The first well may have the same conductivity type as the second well (i.e., the first and second wells may both be p-type wells or n-type wells) or the opposite conductivity type to that of the second well (i.e., the first well may be a p-type well, while the second well is an n-type well, or the first well may be an n-type well, while the second well is a p-type well).

The semiconductor device may further include a contact region formed in the semiconductor substrate of the first region spaced apart from the first trench and having the same conductivity type as the first well. The semiconductor device may further include a first metal interconnection electrically connected to the first capacitor electrode; a second metal interconnection; a third metal interconnection electrically connected to the gate; and/or a fourth metal interconnection electrically connected to the impurity region. The second metal interconnection may be electrically connected to the semiconductor substrate or the first well.

When the first well is a p-type well, a power voltage may be applied to the first metal interconnection and/or a ground voltage may be applied to the second metal interconnection. When the first well is an n-type well, a ground voltage may be applied to the first metal interconnection and/or a power voltage may be applied to the second metal interconnection. When the semiconductor substrate functions as a second capacitor electrode, a ground voltage may be applied to the first metal interconnection and/or a power voltage may be applied to the second metal interconnection.

According to an example embodiment, methods of fabricating semiconductor devices may include preparing a semiconductor substrate that includes first and second regions; etching the semiconductor substrate to form a first trench, having a first depth, in the first region and a second trench, having a second depth, in the second region; forming first, second, and third insulating layers in the second trench; forming a capacitor dielectric layer that includes first and second dielectric layers in the first trench; forming a gate insulating layer on the first and second regions; forming a gate on the gate insulating layer of the second region; forming a first capacitor electrode on the capacitor dielectric layer; and/or forming impurity regions in the semiconductor substrate on sides of the gate.

The semiconductor substrate may function as a second capacitor electrode, and/or at least portions of the first insulating layer, the second insulating layer, and the gate insulating layer that are disposed between the first and second capacitor electrodes may form an oxide-nitride-oxide (ONO) structure of a capacitor dielectric layer.

The methods may further include, before forming the first and second trenches: forming a first well having a first junction depth greater than the first depth of the first trench in the semiconductor substrate of the first region, the first trench being formed in the first well; and/or forming a second well having a second junction depth greater than the second depth of the second trench in the semiconductor substrate of the second region, the second trench being formed in the second well.

The methods may further include, after forming the first trench and the second trench, but before forming the first insulating layer: forming a first well having a first junction depth greater than the first depth of the first trench in the semiconductor substrate of the first region, the first trench being formed in the first well; and/or forming a second well having a second junction depth greater than the second depth of the second trench in the semiconductor substrate of the second region, the second trench being formed in the second well.

The methods may further include, after removing the capacitor dielectric layer, but before forming the gate insulating layer: forming a first well having a first junction depth greater than the first depth of the first trench in the semiconductor substrate of the first region, the first trench being formed in the first well; and/or forming a second well having a second junction depth greater than the second depth of the second trench in the semiconductor substrate of the second region, the second trench being formed in the second well.

The first well may function as a second capacitor electrode, and/or at least portions of the first insulating layer, the second insulating layer, and the gate insulating layer that are formed between the first and second capacitor electrodes may form an ONO structure of a capacitor dielectric layer.

In the methods of fabricating semiconductor devices, the forming of the impurity regions may further include forming a contact region having the same conductivity type as the first well in the semiconductor substrate of the first region and/or spaced apart from the first trench. After forming the impurity regions, the method may further include forming a first metal interconnection electrically connected to the first capacitor electrode, a second metal interconnection electrically connected to the semiconductor substrate or the first well, a third metal interconnection electrically connected to the gate, and/or a fourth metal interconnection electrically connected to one of the impurity regions.

BRIEF DESCRIPTION OF THE DRAWINGS

The above and/or other aspects and advantages will become more apparent and more readily appreciated from the following detailed description of example embodiments taken in conjunction with the accompanying drawings, in which.

DETAILED DESCRIPTION

Figure 1:
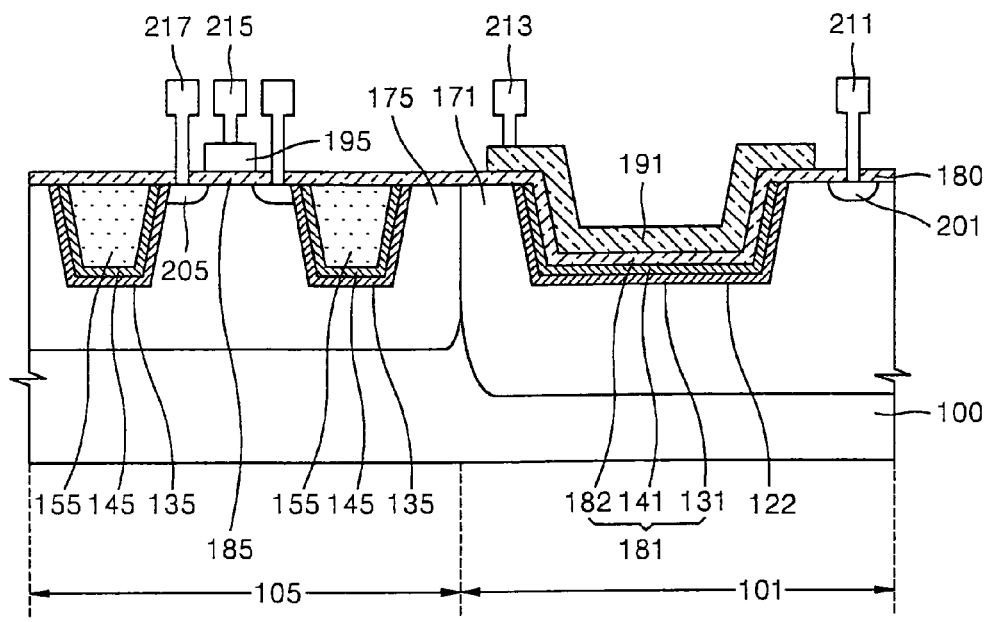
FIG. 1 is a sectional view illustrating a semiconductor device having a STI structure, according to an example embodiment.

Example embodiments will now be described more fully hereinafter with reference to the accompanying drawings. Embodiments, however, may be embodied in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to," or "coupled to" another component, it may be directly on, connected to, or coupled to the other component or intervening components may be present. In contrast, when a component is referred to as being "directly on," "directly connected to," or "directly coupled to" another component, there are no intervening components present. As used herein, the term "and/or" includes any and all combinations of one or more of the associated listed items.

It will be understood that, although the terms first, second, third, etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the example embodiments.

Spatially relative terms, such as "beneath," "below," "lower," "above," "upper," and the like may be used herein for ease of description to describe one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments that may be illustrated in the accompanying drawings, wherein like reference numerals may refer to the like components throughout.

FIG. 1 is a sectional view illustrating a semiconductor device having a STI structure, according to an example embodiment. Referring to FIG. 1, a semiconductor substrate 100 is provided that may include a first region 101 and/or a second region 105. The first region 101 may be an isolation region where an isolation layer is formed, and the second region 105 may be a region where a device, for example, a metal-oxide semiconductor (MOS) transistor is formed.

Here, a relatively greater isolation layer may be formed in the first region 101 than in the second region 105.

The semiconductor substrate 100 may include a first trench 121 formed in the first region 101, and/or a second trench 125 formed in the second region 105 that may have a smaller size than that of the first trench 121. The first trench 121 and/or the second trench 125 may have a depth, for example, greater than or equal to about 4000 Å and/or less than or equal to about 5000 Å. A first well 171 may be formed in the semiconductor substrate 100 of the first region 101, and the first well 171 may have a greater junction depth than that of the first trench 121. The first well 171 may include an n-type well or a p-type well. A second well 175 may be formed in the semiconductor substrate 100 of the second region 105, and the second well 175 may have a greater junction depth than that of the second trench 125. The second well 175 may include an n-type well or a p-type well. The second well 175 may have a junction depth that is less than or equal to that of the first well 171. The first well 171 and the second well 175 may have the same conductivity type as each other or different conductivity types from each other.

A first insulating layer 135 and/or a second insulating layer 145 may be formed on an inner wall of the second trench 125 of the second region 105, and/or a third insulating layer 155 may be buried in the second trench 125. The first insulating layer 135 may include an oxide layer, such as a thermal oxide layer, as a sidewall oxide layer having a thickness, for example, greater than or equal to about 10 Å and/or less than or equal to about 100 Å. The second insulating layer 145 may include a nitride layer as, for example, a liner having a thickness, for example, greater than or equal to about 100 Å and/or less than or equal to about 200 Å. The third insulating layer 155 may include, for example, a high density plasma (HDP) oxide layer and/or a plasma tetraethylorthosilicate (P-TEOS) oxide layer.

A fourth insulating layer 180 may be formed on the semiconductor substrate 100. A portion of the fourth insulating layer 180 corresponding to an active region in the second region 105 may function as a gate insulating layer 185 of a MOS transistor. The fourth insulating layer 180 may include an oxide layer. A gate 195 may be formed on the gate insulating layer 185. The gate 195 may include a polysilicon layer. Impurity regions 205 may be formed in the semiconductor substrate 100 of the active region at both sides of the gate 195. The impurity regions 205 may function as source and/or drain regions of the MOS transistor, and the impurity regions 205 may include high density impurity regions having a conductivity type opposite to that of the second well 175. The impurity regions 205 may include, for example, high density p-type or n-type impurity regions. The impurity regions 205 may include a lightly doped drain (LDD) region.

A capacitor may be formed in the first trench 121 of the first region 101. The first well 171 may function as a second electrode, for example, a lower electrode of the capacitor. A capacitor dielectric layer 181 may be formed in the first trench 121. The capacitor dielectric layer 181 may include an ONO layer, for example, as a first dielectric layer 131, a second dielectric layer 141, and/or a third dielectric layer 182. The first dielectric layer 131 may be formed on an inner wall of the first trench 121, and may include a layer similar to the first insulating layer 135 formed in the second trench 125, for example, an oxide layer. The second dielectric layer 141 may be formed on the first dielectric layer 131, and may include a layer similar to the second insulating layer 145 formed in the second trench 125, for example, a nitride layer. The third dielectric layer 182 may include a layer similar to the gate insulating layer 185, for example, an oxide layer. A plate node 191 may be formed on the capacitor dielectric layer 181. The plate node 191 may include the same material as or similar material to that of the gate 195 of the MOS transistor, for example, a polysilicon layer. The plate node 191 may function as a first electrode of the capacitor, for example, an upper electrode.

Figure 3A:
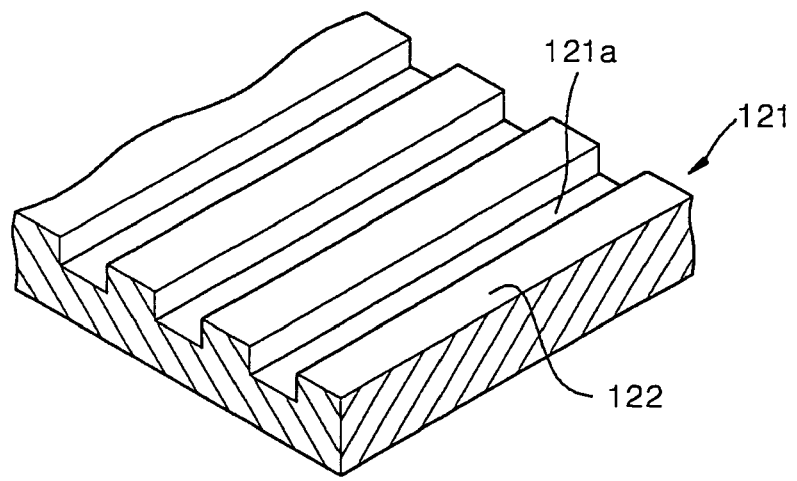
FIGS. 3A through 3C are perspective views illustrating example embodiments of recesses formed on a bottom of a first trench of the semiconductor device of FIG. 1.
Figure 3B:
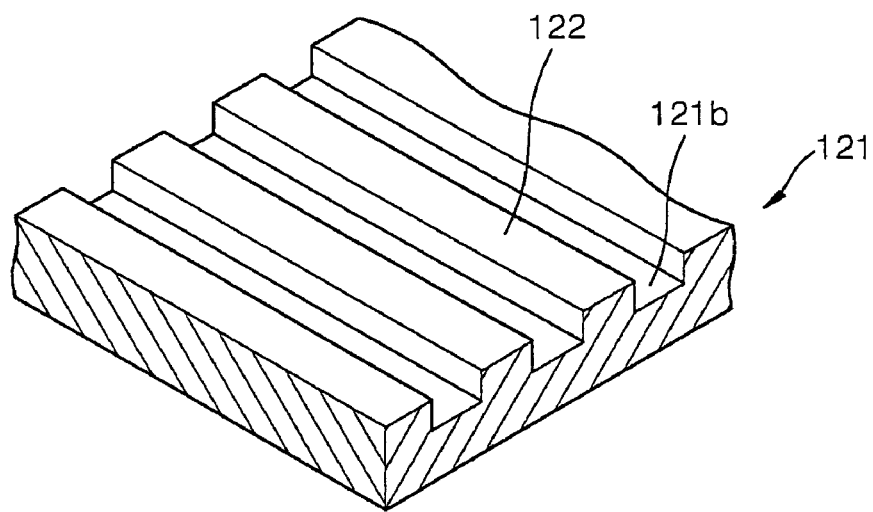
Figure 3C:
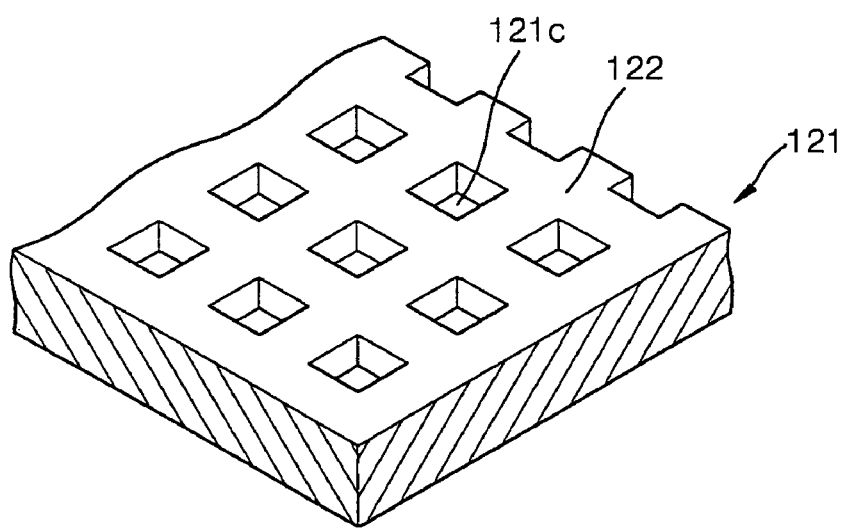

FIGS. 3A through 3C are perspective views illustrating example embodiments of recesses 121a, 121b, and/or 121c formed on a bottom 122 of a first trench 121 of the semiconductor device of FIG. 1. The first trench 121 formed in the first region 101 may include the bottom 122, including one or more of the recesses 121a, 121b, and/or 121c, in order to increase the capacitance of the capacitor. Referring to FIG. 3A, the bottom 122 of the first trench 121 may include one or more stripe-shaped recesses 121a that extend along a first direction, for example, a width direction of the gate 195 (gate-width direction). Referring to FIG. 3B, the bottom 122 of the first trench 121 may include one or more stripe-shaped recesses 121b that extend along a second direction transverse to the first direction, for example, a direction transverse to the gate-width direction. Referring to FIG. 3C, the bottom 122 of the first trench 121 may include one or more mesh-shaped recesses 121c.

A surface area of the inner surface of the first trench 121 may increase when the recesses 121a, 121b, and/or 121c are formed on the bottom 122 of the first trench 121. Thus, a surface area of a lower electrode of a capacitor may increase, and a contact area between the capacitor dielectric layer 181 and the first well 171 as a lower electrode of the capacitor may increase, thereby increasing the capacitance of the capacitor. In example embodiments, the recesses 121a, 121b, and/or 121c may have one or more rectangular shapes, semicircular shapes, triangular shapes, and/or the like.

A contact region 201 may be formed in the first well 171, spaced apart from the first trench 121. When the first well 171 is an n-type well, the contact region 201 may include an n-type high density impurity region, and when the first well 171 is a p-type well, the contact region 201 may include a p-type high density impurity region. A first metal interconnection 211, a second metal interconnection 213, a third metal interconnection 215, and/or a fourth metal interconnection 217 may be formed on the semiconductor substrate 100. The first metal interconnection 211, the second metal interconnection 213, the third metal interconnection 215, and/or the fourth metal interconnection 217 may be electrically connected to the contact region 201, the plate node 191, the gate electrode 195, and/or the impurity region 205. An interlayer insulating layer (not shown) may be interposed between the first metal interconnection 211, second metal interconnection 213, third metal interconnection 215, and/or fourth metal interconnection 217, and the semiconductor substrate 100.

The first metal interconnection 211 may be electrically connected to the contact region 201, and may provide a first power voltage to the first well 171 functioning as a capacitor lower electrode. The second metal interconnection 213 may be electrically connected to the plate node 191 functioning as a capacitor upper electrode, and may provide a second power voltage. The third metal interconnection 215 may be electrically connected to the gate 195 of the MOS transistor, and may provide a gate voltage. The fourth metal interconnection 217 may be electrically connected to one of the impurity regions 205, and may provide source and/or drain voltages.

In an example embodiment, the first well 171, that may be formed in the first region 101, may function as a lower electrode of the capacitor, but the semiconductor substrate 100 may be used as a lower electrode of the capacitor without forming the first well 171. The second well 175 may not be formed in the second region 105.

When the first well 171 is formed in the semiconductor substrate 100 of the first region 101, and when the first well 171 is a p-type well, a power voltage Vdd as a first power voltage may be provided to the first metal interconnection 211, and/or a ground voltage Vss as a second power voltage may be provided to the second metal interconnection 213. Or, when the first well 171 is an n-type well, a ground voltage Vss as a first power voltage may be provided to the first metal interconnection 211, and/or a power voltage Vdd as a second power voltage may be provided to the second metal interconnection 213. In the alternative, when the first well 171 is not formed in the semiconductor substrate 100 of the first region 101, a ground voltage Vss as a first power voltage may be provided to the first metal interconnection 211, and/or a power voltage Vdd as a second power voltage may be provided to the second metal interconnection 213.

FIGS. 2A through 2J are sectional views illustrating methods of fabricating the semiconductor device of FIG. 1, according to example embodiments.

Figure 2A:
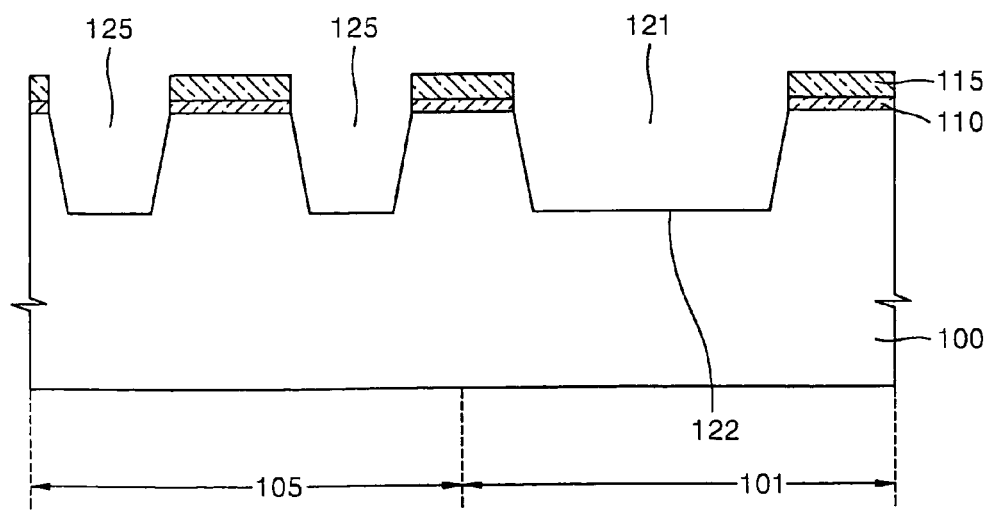
FIGS. 2A through 2J are sectional views illustrating methods of fabricating the semiconductor device of FIG. 1, according to example embodiments.

Referring to FIG. 2A, a pad oxide layer 110 and/or a hard mask layer 115 may be formed on a semiconductor substrate 100, that itself may include a first region 101 and/or a second region 105. After a photosensitive layer (not shown) is formed on the hard mask layer 115, the photosensitive layer may be patterned so as to expose a portion of the hard mask layer 115 where an isolation layer will be formed. The exposed hard mask layer 115 and/or the pad oxide layer 110 may be etched using the photosensitive layer as a mask so as to expose a portion of the semiconductor substrate 100 where the isolation layer will be formed. The exposed portion of the semiconductor substrate 100 may be etched to a depth, for example, greater than or equal to about 4000 Å and/or less than or equal to about 5000 Å, thereby forming a first trench 121 in the first region 101, and/or a second trench 125 in the second region 105. The depth may or may not be predetermined.

At this time, the first trench 121 formed in the first region 101 may be where a dielectric layer of a capacitor will be formed, and/or may have recesses 121a, 121b, and/or 121c in a bottom 122 of the first trench 121 in order to increase the capacitance of the capacitor. The recesses 121a, 121b, and/or 121c may have one or more striped shapes or mesh shapes, as illustrated in FIGS. 3A through 3C, and/or one or more other shapes.

Figure 2B:
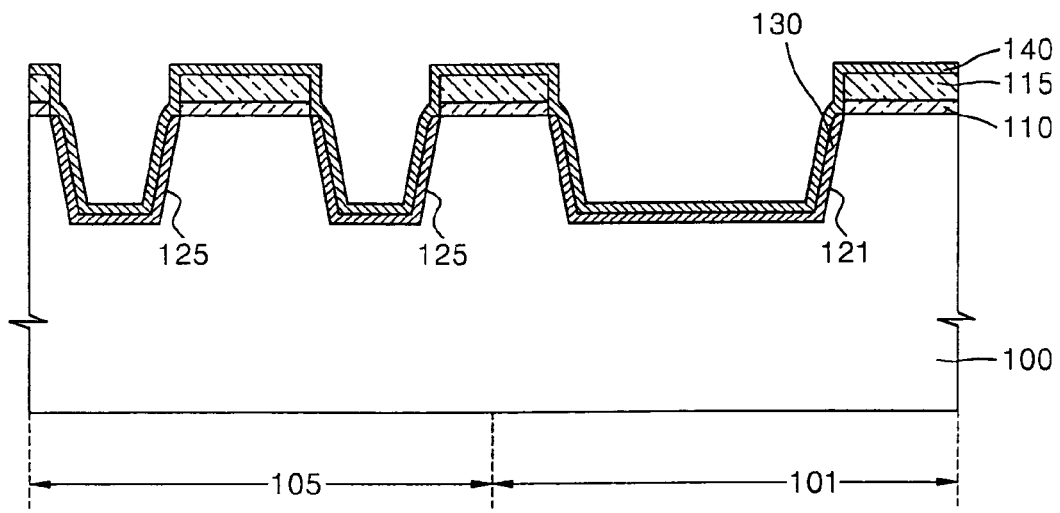
Figure 2C:
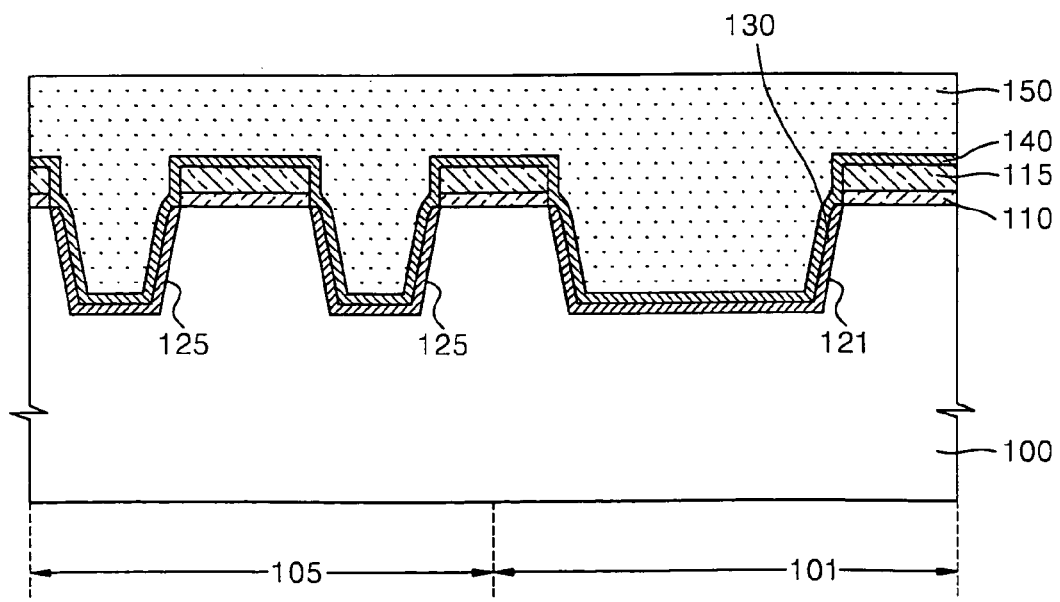

Referring to FIG. 2B, a first fabricating layer 130 may be formed in the first trench 121 and/or the second trench 125, and a second fabricating 140 may be formed on the resultant structure. An oxide layer (such as a thermal oxide layer), as the first fabricating layer 130, may be formed to a thickness, for example, greater than or equal to about 10 Å and/or less than or equal to about 100 Å, and a nitride layer, as the second fabricating layer 140, may be formed to a thickness, for example, greater than or equal to about 100 Å and/or less than or equal to about 200 Å. Referring to FIG. 2C, a third fabricating layer 150 may be formed on the second fabricating layer 140 so that the first trench 121 and/or the second trench 125 is/are completely buried. The third fabricating layer 150 may include, for example, a HDP oxide layer and/or a P-TEOS oxide layer. Before the third fabricating layer 150 is formed, a medium temperature oxide (MTO) layer may be formed on the second fabricating layer 140.

Figure 2D:
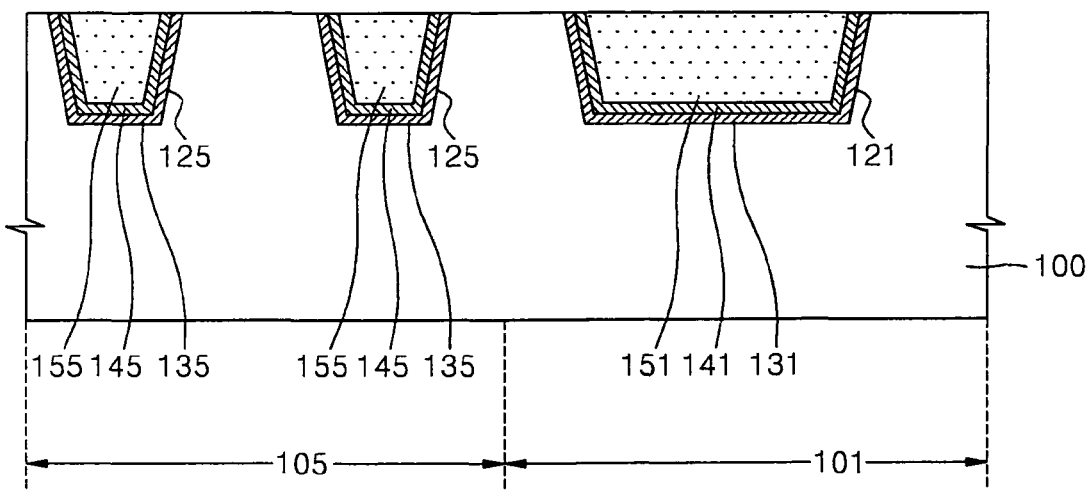

Referring to FIG. 2D, the third fabricating layer 150 may be etched using, for example, a chemical mechanical polishing (CMP) process until the hard mask layer 115 may be exposed so as to substantially planarize the third fabricating layer 150. Then, the hard mask layer 115 and/or the pad oxide layer 110 may be removed, thereby forming an isolation layer 151 in the first trench 121 of the first region 101 and/or a third insulating layer 155 in the second trench 125 of the second region 105. Thus, a first dielectric layer 131 (for example, an oxide layer), a second dielectric layer 141 (for example, a nitride layer), and/or an isolation layer 151 may be formed in the first trench 121. A first insulating layer 135, a second insulating layer 145, and/or a third insulating layer 155 may be formed in the second trench 125.

Figure 2E:
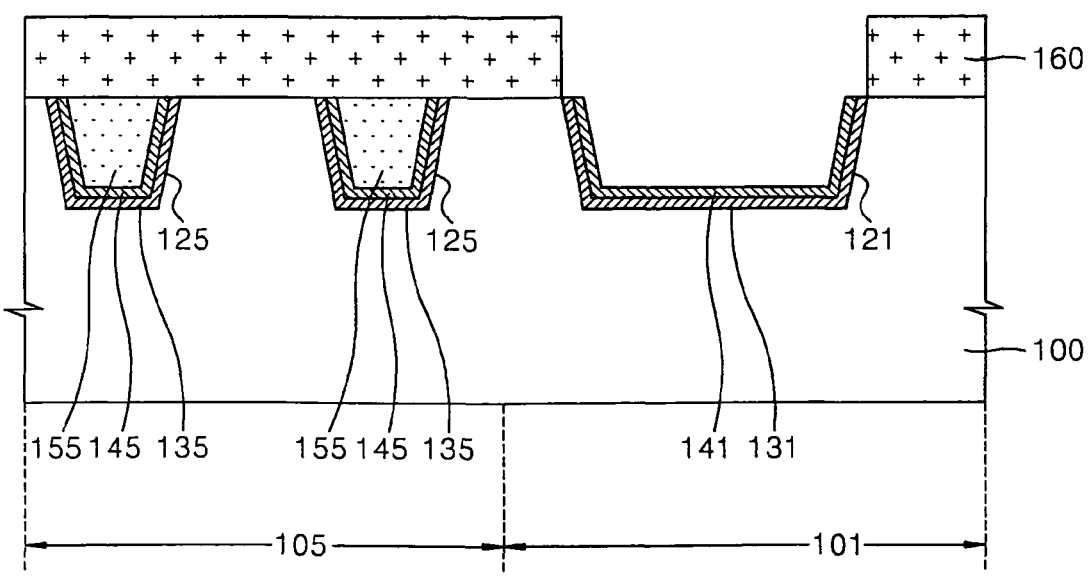
Figure 2F:
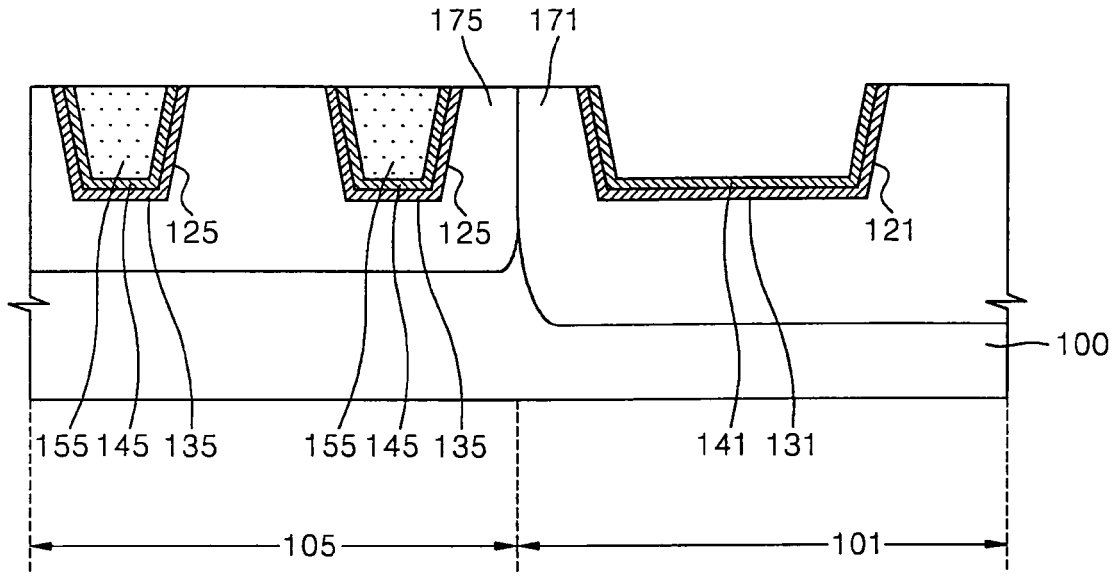

Referring to FIG. 2E, a photosensitive layer 160 may be formed on the semiconductor substrate 100 so that the isolation layer 151 is exposed. The exposed isolation layer 151 may be etched using the photosensitive layer 160 as a mask so as to expose the second dielectric layer 141. Referring to FIG. 2F, the photosensitive layer 160 may be removed so as to expose the third insulating layer 155, the second dielectric layer 141, and the semiconductor substrate 100. Then, a first well 171 may be formed in the semiconductor substrate 100 of the first region 101, and/or a second well 175 may be formed in the semiconductor substrate 100 of the second region 105. Thus, the first trench 121 may be arranged in the first well 171, and the second trench 125 may be arranged in the second well 175.

Figure 2G:
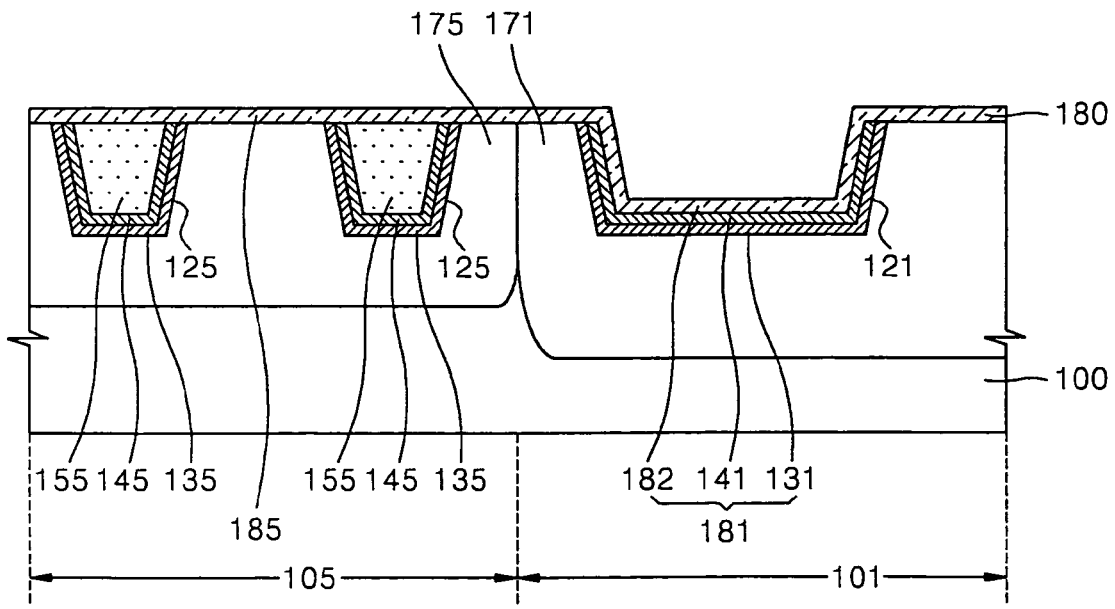

Referring to FIG. 2G, a fourth insulating layer 180 may be formed on the exposed third insulating layer 155, the exposed second dielectric layer 141, and/or the exposed portion of the semiconductor substrate 100. A first portion of the fourth insulating layer 180, that may be formed on the semiconductor substrate 100 of the active region between the third insulating layer 155 of the second region 105, may function as a gate insulating layer 185, and/or a second portion, that may be formed on the second dielectric layer 141 in the first trench 121 of the first region 101, may function as a third dielectric layer 182 of the capacitor. Thus, a capacitor dielectric layer 181 of an ONO structure, that may be composed, for example, of the first dielectric layer 131, the second dielectric layer 141, and/or the third dielectric layer 182, may be formed.

In another example embodiment, when a fourth insulating layer 180 is formed, but not on the second dielectric layer 141, the capacitor dielectric layer 181 may be formed of an oxide-nitride (ON) structure, that may be composed of the first dielectric layer 131 and/or the second dielectric layer 141. When the recesses 121a, 121b, and/or 121c are formed on the bottom 122 of the first trench 121 of the first region 101, a contact area between the first well 171, as the capacitor lower electrode, and the capacitor dielectric layer 181 may be increased, thereby increasing the capacitance of the capacitor.

Figure 2H:
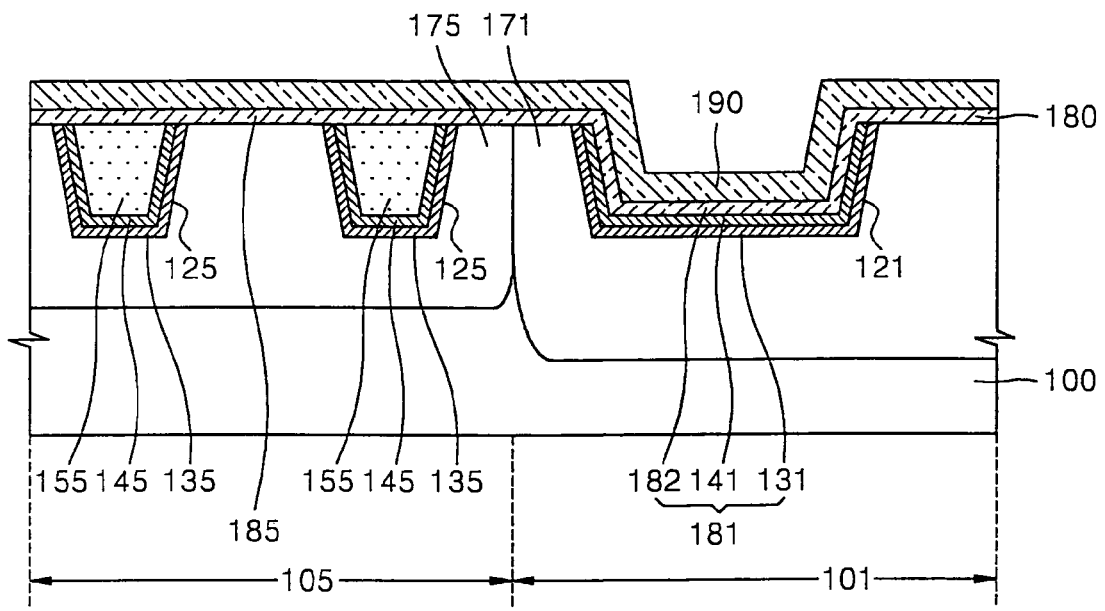
Figure 2I:
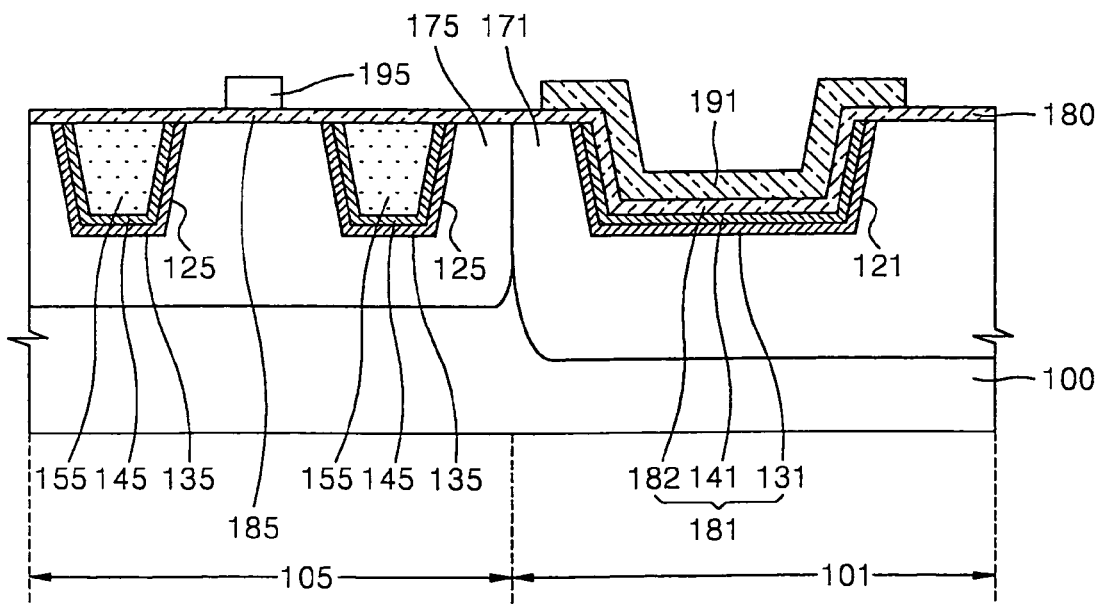
Figure 2J:
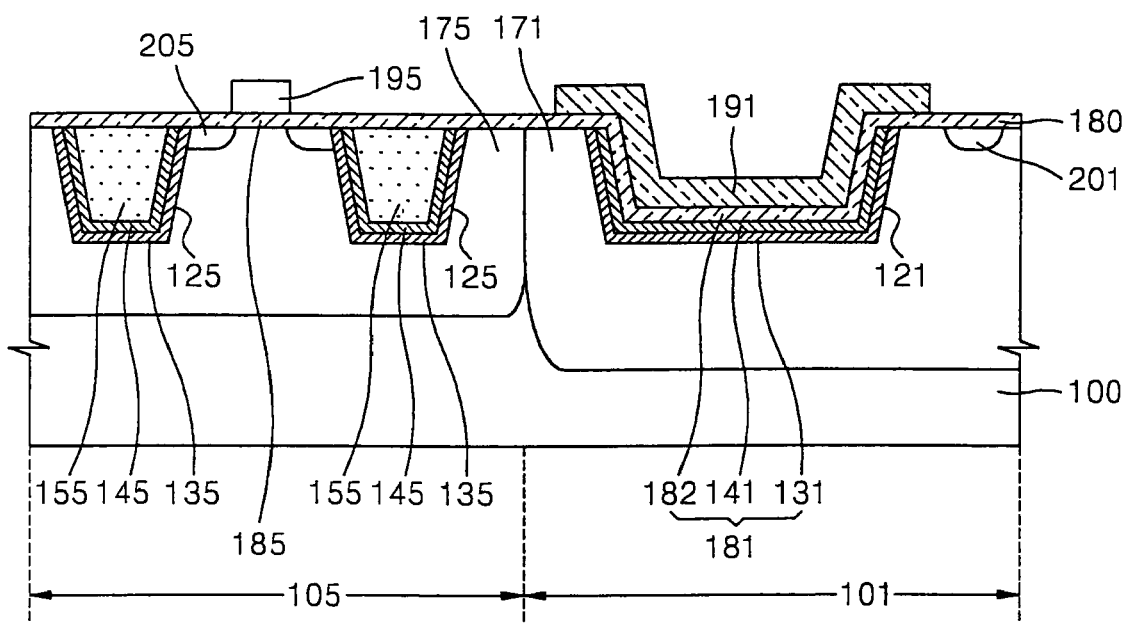

Referring to FIG. 2H, a polysilicon layer 190 may be formed on the fourth insulating layer 180. Referring to FIG. 2I, the polysilicon layer 190 may be patterned, thereby forming a gate 195 on the gate insulating layer 185 and/or a plate node 191 on the capacitor dielectric layer 181. Referring to FIG. 2J, a contact region 201 may be formed in the first well 171, and/or impurity regions 205 may be formed in the second well 175 at both sides of the gate 195. The contact region 201 may include, for example, a high density impurity region having the same conductivity type as the first well 171. The impurity regions 205 may include high density impurity regions having opposite conductivity type to the second well 175.

Then, an insulating layer (not shown) and/or first metal interconnection 211, second metal interconnection 213, third metal interconnection 215, and/or fourth metal interconnection 217 may be formed on the semiconductor substrate 100, thereby completing the semiconductor device shown in FIG. 1. The first metal interconnection 211 may electrically contact the contact region 201, the second metal interconnection 213 may electrically contact the plate node 191, the third metal interconnection 215 may electrically contact the gate 195, and/or the fourth metal interconnection 217 may electrically contact the impurity region 205.

In the method of fabricating the semiconductor device according to an example embodiment, after the first well 171 is formed in the first region 101, and the second well 175 is formed in the second region 105, the process of forming the capacitor and/or the MOS transistor shown in FIGS. 2A through 2J may be performed, thereby completing the semiconductor device of FIG. 1.

In the alternative, in the method of fabricating the semiconductor device according to another example embodiment, after the first trench 121 is formed in the first region 101 and/or the second trench is formed in the second region 105 as shown in FIG. 2A, the first well 171 may be formed in the first region 101 and/or the second well 175 may be formed in the second region 105. Then, the processes of forming the capacitor and/or the MOS transistor shown in FIGS. 2B through 2J may be performed, thereby completing the semiconductor device of FIG. 1.

As described above, the semiconductor devices and the methods of fabricating the semiconductor devices according to example embodiments may provide an effect of increasing the capacitance of the capacitor without increasing a chip area by forming the capacitor in the isolation region where the isolation layer is formed. Further, the fabrication processes may be simplified and/or the fabrication cost may be reduced by forming the capacitor dielectric layer during the process of forming the isolation layer. Since the capacitor electrode may be formed during forming of the gate of the MOS transistor, the fabrication processes may be simplified. Further, since the trench for the capacitor may be formed concurrently with the trench for the isolation layer, the fabrication processes may be simplified.

While example embodiments have been particularly shown and described, it will be understood by those of ordinary skill in the art that various changes in form and details may be made therein without departing from the spirit and scope of the present invention as defined by the following claims.

What is claimed is:

1. A method of fabricating a semiconductor device, the method comprising:
   preparing a semiconductor substrate that includes first and second regions;
   etching the semiconductor substrate to form a first trench in the first region and a second trench in the second region;
   forming sidewall oxide layers on inner surfaces of the first and second trenches;
   forming nitride layers on the sidewall oxide layers in the first and second trenches;
   forming a field oxide layer on the nitride layer in only the second trench, the field oxide layer filling the second trench;
   forming a gate oxide layer on the first and second regions;
   forming conductive layers on a first portion of the gate oxide layer in the first trench and on a second portion of the gate oxide layer in the second region; and
   forming impurity regions in the semiconductor substrate on sides of the conductive layer on the second portion of the gate oxide layer,
   wherein the conductive layer on the first portion of the gate oxide layer functions as an upper electrode of a capacitor, and
   wherein the sidewall oxide layer on the inner surface of the first trench, the nitride layer on the sidewall oxide layer in the first trench, and the first portion of the gate oxide layer on the nitride layer in the first trench function as a dielectric of the capacitor.

2. The method of claim 1, wherein forming the sidewall oxide layers further comprises thermally oxidizing the semiconductor substrate having the first and second trenches.

3. The method of claim 1, wherein the sidewall oxide layer on the inner surface of the first trench has the same thickness as the sidewall oxide layer on the inner surface of the second trench.

4. The method of claim 1, wherein the nitride layer in the first trench has the same thickness as the nitride layer in the second trench.

5. The method of claim 1, wherein the conductive layer on a first portion of the gate oxide layer has the same thickness as the conductive layer on a second portion of the gate oxide layer.

6. The method of claim 1, wherein the semiconductor substrate functions as a bottom electrode of the capacitor.

7. The method of claim 6, wherein a ground voltage is applied to the semiconductor substrate, and a power voltage is applied to the conductive layer on a first portion of the gate oxide layer.

8. The method of claim 6, further comprising, after forming the impurity regions:
   forming a first metal interconnection electrically connected to the conductive layer on a first portion of the gate oxide layer;
   forming a second metal interconnection electrically connected to the semiconductor substrate;
   forming a third metal interconnection electrically connected to the conductive layer on a second portion of the gate oxide layer; and
   forming a fourth metal interconnection electrically connected to one of the impurity regions.

9. The method of claim 1, wherein forming the field oxide layer on the nitride layer in the second trench further comprises:
   forming a oxide layer on the nitride layers in the first and second trenches; and
   selectively removing the oxide layer on the nitride layer in the first trench to remain the field oxide layer on the nitride layer in the second trench.

10. The method of claim 1, further comprising:
    forming a first well in the first region; and
    forming a second well in the second region;
    wherein the first well has a first junction depth greater than a depth of the first trench,
    wherein the second well has a second junction depth greater than a depth of the second trench,
    wherein the first trench is formed in the first well, and
    wherein the second trench is formed in the second well.

11. The method of claim 10, wherein the first well functions as a bottom electrode of the capacitor.

12. The method of claim 10, wherein the first junction depth is greater than or equal to the second junction depth, and
    wherein the first and second wells have a same conductivity type.

13. The method of claim 10, further comprising:
    forming a contact region in the first region;
    wherein the contact region is spaced apart from the first trench, and
    wherein the contact region and the first well have a same conductivity type.

14. The method of claim 10, further comprising:
forming a first metal interconnection electrically connected to the conductive layer on a first portion of the gate oxide layer;
forming a second metal interconnection electrically connected to the first well;
forming a third metal interconnection electrically connected to the conductive layer on a second portion of the gate oxide layer; and
forming a fourth metal interconnection electrically connected to one of the impurity regions.

15. The method of claim 14, wherein when the first well is a p-type well, a power voltage is applied to the first metal interconnection and a ground voltage is applied to the second metal interconnection, and
wherein when the first well is an n-type well, the ground voltage is applied to the first metal interconnection and the power voltage is applied to the second metal interconnection.

16. The method of claim 1, wherein a bottom of the first trench includes one or more stripe-shaped recesses extending in a same direction.

17. The method of claim 1, wherein a bottom of the first trench includes one or more mesh-shaped recesses.

18. The method of claim 1, wherein the dielectric of the capacitor comprises a ONO layer of the sidewall oxide layer on the inner surface of the first trench, the nitride layer on the sidewall oxide layer in the first trench, and the first portion of the gate oxide layer on the nitride layer in the first trench.

19. The method of claim 18, wherein the ONO layer has a same thickness with a total thickness of the sidewall oxide layer on the inner surface of the second trench, the nitride layer on the sidewall oxide layer in the second trench, and the second portion of the gate oxide layer.

20. A method of fabricating a semiconductor device, the method comprising:
preparing a semiconductor substrate that includes first and second regions;
etching the semiconductor substrate to form a first trench in the first region and a second trench in the second region;
forming a first fabricating layer in the first and second trenches;
forming a second fabricating layer on the first fabricating layer and the semiconductor substrate;
forming a third fabricating layer on only the second fabricating layer;
etching the second and third fabricating layers to form first and second dielectric layers and an isolation layer in the first trench, and first, second, and third insulating layers in the second trench;
removing the isolation layer;
forming a gate insulating layer on the first and second regions;
forming a gate on the gate insulating layer of the second region;
forming a first capacitor electrode on the gate insulating layer of the first region; and
forming impurity regions in the semiconductor substrate on sides of the gate.

* * * * *